(12) United States Patent
Huang et al.

(10) Patent No.: US 9,589,884 B2
(45) Date of Patent: Mar. 7, 2017

(54) INTEGRATED CIRCUIT DEVICE WITH RADIO FREQUENCY (RF) SWITCHES AND CONTROLLER

(71) Applicant: Semiconductor Manufacturing International (Shanghai) Corporation, Shanghai (CN)

(72) Inventors: Herb He Huang, Shanghai (CN); Clifford Ian Drowley, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/572,462

(22) Filed: Dec. 16, 2014

(65) Prior Publication Data

US 2015/0214221 A1 Jul. 30, 2015

(30) Foreign Application Priority Data

Jan. 26, 2014 (CN) .......................... 2014 1 0038083

(51) Int. Cl.
| | | |
|---|---|---|
| *H01L 21/8244* | (2006.01) | |
| *H01L 23/50* | (2006.01) | |
| *H01L 21/822* | (2006.01) | |
| *H01L 27/06* | (2006.01) | |

(Continued)

(52) U.S. Cl.
CPC .......... *H01L 23/50* (2013.01); *H01L 21/8221* (2013.01); *H01L 27/0688* (2013.01); *H01L 27/0207* (2013.01); *H01L 27/088* (2013.01); *H01L 2224/18* (2013.01); *H01L 2924/0002* (2013.01)

(58) Field of Classification Search
CPC . H01L 21/8221; H01L 23/50; H01L 27/0688; H01L 2224/18; H01L 2924/0002; H01L 2924/00; H01L 27/088; H01L 27/0207; H01L 21/823475
USPC ........................................................... 257/390
See application file for complete search history.

(56) References Cited

U.S. PATENT DOCUMENTS

| | | | |
|---|---|---|---|
| 2010/0190334 A1* | 7/2010 | Lee | ..................... H01L 21/2007 438/637 |
| 2011/0143506 A1* | 6/2011 | Lee | ....................... H01L 23/481 438/238 |

(Continued)

*Primary Examiner* — Thanh T Nguyen
(74) *Attorney, Agent, or Firm* — Innovation Counsel LLP

(57) ABSTRACT

An integrated circuit device may include the following elements: a first semiconductor substrate; a first transistor set positioned in the first semiconductor substrate; a first dielectric layer covering a gate electrode of the first transistor set; a first interconnect member positioned in the first dielectric layer and electrically connected to the first transistor set; a second semiconductor substrate; a second transistor set positioned in the second semiconductor substrate and structurally different from the first transistor set; a second dielectric layer connected to the first dielectric layer, positioned between the first dielectric layer and the second semiconductor substrate, and covering a gate electrode of the second transistor set; and a second interconnect member positioned in the second dielectric layer, electrically connected to a terminal of the second transistor set, and electrically connected to the first interconnect member.

14 Claims, 5 Drawing Sheets

(51) Int. Cl.
   *H01L 27/088* (2006.01)
   *H01L 27/02* (2006.01)

(56) References Cited

U.S. PATENT DOCUMENTS

2011/0233702 A1* 9/2011 Takahashi ......... H01L 21/76898
                                                       257/432
2013/0112849 A1* 5/2013 Shimotsusa ....... H01L 27/14634
                                                       250/206

* cited by examiner

INTEGRATED CIRCUIT DEVICE WITH RADIO FREQUENCY (RF) SWITCHES AND CONTROLLER

CROSS-REFERENCE TO RELATED APPLICATION

This application claims priority to and benefit of Chinese Patent Application No. 201410038083.3, filed on 26 Jan. 2014, the Chinese Patent Application being incorporated herein by reference in its entirety.

BACKGROUND OF THE INVENTION

The present invention is related to an integrated circuit device and a method for manufacturing the integrated circuit device. The integrated circuit device may include a plurality of semiconductor devices.

An integrated circuit device, such as a radio frequency front-end module (RF FEM), may be an essential component of an electronic device, such as a wireless communication device (e.g., one of a mobile phone, a smartphone, a tablet, etc.). The RF FEM may include an RF switch and other semiconductor devices. For the wireless communication device to function properly, the RF switch may need to have substantially high signal fidelity, low insertion loss, acceptable linearity, and minimal signal distortion.

Conventionally, an RF switch may include a gallium arsenide (GaAs) semiconductor transistor and related circuit elements. Such a conventional RF switch may require substantially high processing, manufacturing and packaging costs.

Alternatively, an RF switch may include a thin film silicon-on-insulator (SOI) metal-oxide-semiconductor field-effect transistor (MOSFET) and related circuit elements. Nevertheless, in such an RF switch, the silicon thin film at the top portion of the substrate may be substantially thin (e.g., in the range of 0.1 to 0.6 microns). Therefore, implementation of related circuit elements, such as a switch control circuit logic element and/or an amplifier element, on the silicon thin film may be substantially difficult.

SUMMARY

An embodiment of the present invention may be related to an integrated circuit device. The integrated circuit device may include the following elements: a first semiconductor substrate; a first transistor set at least partially positioned in the first semiconductor substrate; a first dielectric layer overlapping the first semiconductor substrate and covering a gate electrode of the first transistor set; a first interconnect member at least partially positioned in the first dielectric layer and electrically connected to a terminal of the first transistor set; a second semiconductor substrate; a second transistor set at least partially positioned in the second semiconductor substrate; a second dielectric layer connected to the first dielectric layer, positioned between the first dielectric layer and the second semiconductor substrate, and covering a gate electrode of the second transistor set, wherein the first dielectric layer is positioned between the second dielectric layer and the first semiconductor substrate; a second interconnect member at least partially positioned in the second dielectric layer and electrically connected to a terminal of the second transistor set; a third dielectric layer, wherein the first semiconductor substrate is positioned between the third dielectric layer and the first dielectric layer; a third interconnect member extending through the third dielectric layer and electrically connected to the first interconnect member; and a fourth interconnect member extending through the third dielectric layer and electrically connected to the second interconnect member.

The first transistor set may be a semiconductor radio frequency switch. The second transistor set may include a first transistor and a second transistor that are compatible with the semiconductor radio frequency switch. The first transistor may be part of a logic control circuit of the integrated circuit device. The second transistor may be part of an amplifier circuit of the integrated circuit device.

The first transistor set may include metal-oxide-semiconductor field-effect transistors that are electrically connected in a series connection, share a source electrode and a drain electrode, and form a comb-shaped structure.

The second transistor set may include a laterally diffused metal oxide semiconductor field-effect transistor.

The integrated circuit device may include the following elements: a fourth dielectric layer overlapping the third dielectric layer, wherein the third dielectric layer may be positioned between the fourth dielectric layer and the first semiconductor substrate; a first passive device at least partially positioned in the fourth dielectric layer; a second passive device at least partially positioned in the fourth dielectric layer; and a fifth interconnect member at least partially positioned in the fourth dielectric layer and electrically connected to at least two of the first passive device, the second passive device, the third interconnect member, and the fourth interconnect member.

The integrated circuit device may include the following elements: a fourth dielectric layer overlapping the third dielectric layer, wherein the third dielectric layer may be positioned between the fourth dielectric layer and the first semiconductor substrate; a first passive device at least partially positioned in the fourth dielectric layer; and a second passive device at least partially positioned in the fourth dielectric layer and electrically connected to the first passive device. Neither of the first passive device and the second passive device overlaps any semiconductor device at least partially positioned in the first semiconductor substrate or the second semiconductor substrate in a direction perpendicular to an interface between the second semiconductor substrate and the second dielectric layer.

Each of the first semiconductor substrate and the second semiconductor substrate may be formed of a monocrystalline silicon material. Each of the first dielectric layer, the second dielectric layer, and the third dielectric layer may be formed of a silicon-containing dielectric material.

The integrated circuit device may include a dielectric element positioned in the first semiconductor substrate. Four portions of the fourth interconnect member may be respectively surrounded by the third dielectric layer, the dielectric element, the first dielectric layer, and the second dielectric layer.

The first transistor set may include a depletion-mode metal-oxide-semiconductor field-effect transistor.

At least one of the third interconnect member and the fourth interconnect member may be formed of at least one of a silicon-containing semiconductor material, tungsten, and copper.

At least one of the first interconnect member and the second interconnect member may be formed of tungsten.

A surface resistance of the second semiconductor substrate may be greater than or equal to 100 ohms per square micron.

An embodiment of the present invention may be related to an integrated circuit device that may include the following elements: a first semiconductor substrate; a first transistor set at least partially positioned in the first semiconductor substrate; a first dielectric layer overlapping the first semiconductor substrate and covering a gate electrode of the first transistor set; a first interconnect member at least partially positioned in the first dielectric layer and electrically connected to a terminal of the first transistor set; a second semiconductor substrate; a second transistor set at least partially positioned in the second semiconductor substrate, wherein a structure of the second transistor set may be substantially different from a structure of the first transistor set; a second dielectric layer connected to the first dielectric layer, positioned between the first dielectric layer and the second semiconductor substrate, and covering a gate electrode of the second transistor set, wherein the first dielectric layer may be positioned between the second dielectric layer and the first semiconductor substrate; and a second interconnect member at least partially positioned in the second dielectric layer, electrically connected to a terminal of the second transistor set, and electrically connected to the first interconnect member.

An embodiment of the present invention may be related to a method for manufacturing an integrated circuit device. The method may include the following steps: preparing a composite semiconductor substrate that including a carrier substrate, a buried insulating layer, and a first semiconductor substrate that overlap each other, wherein the buried insulating layer may be positioned (and sandwiched) between the carrier substrate and the first semiconductor substrate; forming a dielectric element in the first semiconductor substrate; forming a first transistor set in the first semiconductor substrate;

forming a first dielectric layer on the first semiconductor substrate, such that the first dielectric layer covers a gate electrode of the first transistor set; forming a first interconnect member, which may be at least partially positioned in the first dielectric layer and may be electrically connected to a terminal of the first transistor set; preparing a second semiconductor substrate; forming a second transistor set in the second semiconductor substrate; forming a second dielectric layer on the second semiconductor substrate, such that the second dielectric layer covers at least a gate electrode of the second transistor set; forming a second interconnect member, which may be at least partially positioned in the second dielectric layer and may be electrically connected a terminal of the second transistor set; connecting the first semiconductor substrate to the second semiconductor substrate through the first dielectric layer and the second dielectric layer; removing the carrier substrate; forming a third dielectric layer on the first semiconductor substrate, such that the first semiconductor substrate may be positioned between the third dielectric layer and the first dielectric layer; forming a third interconnect member, which extends through the third dielectric layer and may be electrically connected to the first interconnect member; and forming a fourth interconnect member, which extends through the third dielectric layer and may be electrically connected to the second interconnect member.

The method may include the following steps: forming a fourth dielectric layer on the third dielectric layer, wherein the third dielectric layer may be positioned between the fourth dielectric layer and the first semiconductor substrate; forming a first passive device in the fourth dielectric layer;

forming a second passive device in the fourth dielectric layer; and forming a fifth interconnect member, which may be at least partially positioned in the fourth dielectric layer and may be electrically connected to at least two of the first passive device, the second passive device, the third interconnect member, and the fourth interconnect member.

The fifth interconnect member may be electrically connected to each of the first passive device, the third interconnect member, and the fourth interconnect member.

The first transistor set may be a semiconductor radio frequency switch. The second transistor set may include a first transistor and a second transistor that may be compatible with the semiconductor radio frequency switch, wherein the first transistor may be part of a logic control circuit of the integrated circuit device, and wherein the second transistor may be part of an amplifier circuit of the integrated circuit device.

Four portions of the fourth interconnect member may be respectively surrounded by the third dielectric layer, the dielectric element, the first dielectric layer, and the second dielectric layer. The third interconnect member may be surrounded by each of the third dielectric layer, the dielectric element, and the first dielectric layer without being surrounded by the second dielectric layer.

According to embodiments of the invention, for manufacturing an integrated circuit device, a first set of integrated circuit device components and a second set of integrated circuit device components (structurally different from the first set) may be separately configured and optimized, may be joined through one or more wafer bonding processes, and may be electrically connected through via interconnection techniques. Advantageously, manufacturing of the integrated circuit device may be substantially effective and efficient, and quality and performance of the integrated circuit device may be substantially satisfactory. Embodiments of the invention may be suitable for RF switch devices.

The above summary is related to one or more of many embodiments of the invention disclosed herein and is not intended to limit the scope of the invention.

DETAILED DESCRIPTION

Figure 1:
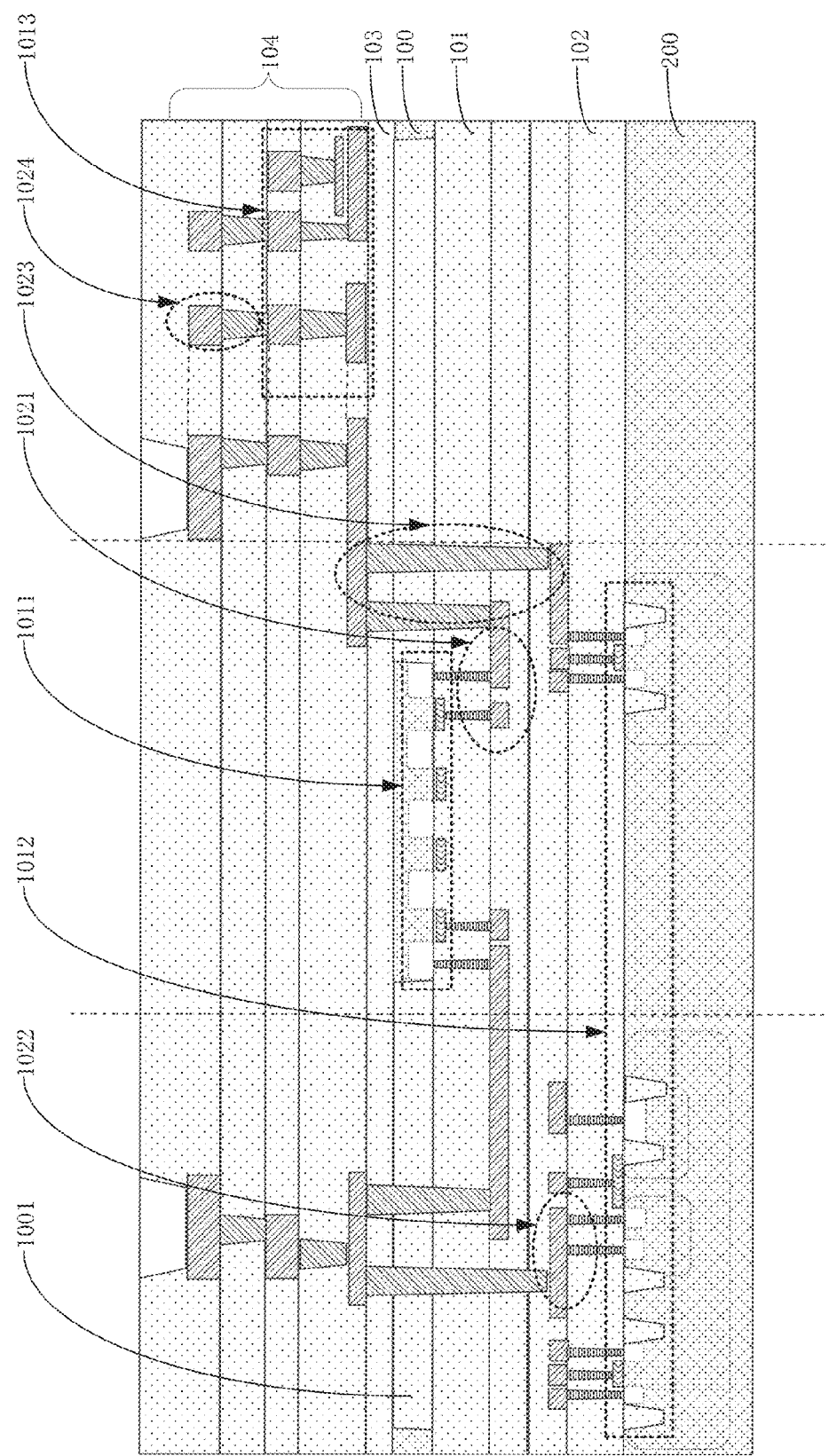
FIG. 1 shows a schematic cross-sectional view that illustrates elements and structures of an integrated circuit device in accordance with an embodiment of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1 shows a schematic cross-sectional view that illustrates elements and structures of an integrated circuit device in accordance with an embodiment of the present invention. The integrated circuit device may include a plurality of semiconductor devices, such as a plurality of transistors. The integrated circuit device may be/include one or more of a functionally standalone product, a product module, an intermediate product, a semi-finished product, etc.

As illustrated in FIG. 1, the integrated circuit device may include a first component set that may include the following elements: a first semiconductor substrate 100; a first transistor set 1011 including at least one transistor and positioned in the first semiconductor substrate 100; a first dielectric layer 101 overlapping (and contacting) the first semiconductor substrate 100 and covering at least one gate electrode of the first transistor set 1011; a first interconnect set 1021 including at least one interconnect member, positioned in the first dielectric layer 101, and electrically connected to one or more terminals (e.g., one or more source electrodes, drain electrodes, and/or gate electrodes) of the first transistor set 1011.

The integrated circuit device may include a second component set that may include the following elements: a second semiconductor substrate 200; a second transistor set 1012 including at least one transistor, positioned in the second semiconductor substrate 200, and structurally different from the first transistor set 1011; a second dielectric layer 102 overlapping (and contacting) the second semiconductor substrate 200 and covering at least one gate electrode of the second transistor set 1012; a second interconnect set 1022 including at least one interconnect member, positioned in the second dielectric layer 102, and electrically connected to one or more terminals (e.g., one or more source electrodes, drain electrodes, and/or gate electrodes) of the second transistor set 1012.

The first component set and the second component set may be separately prepared, configured, and/or optimized. Advantageously, the manufacturing process of the semiconductor may be substantially flexible and efficient.

The first semiconductor substrate 100 may overlap the second semiconductor substrate 200. The first dielectric layer 101 and the second dielectric layer 102 may be positioned between the first semiconductor substrate 100 and the second semiconductor substrate 200. The first semiconductor substrate 100 may be (mechanically) connected to the second semiconductor substrate 200 through the first dielectric layer 101 and the second dielectric layer 102. The first dielectric layer 101 may be adhered to the second dielectric layer 102 through an adhesive element (e.g., an adhesive layer).

The integrated circuit device may include the following elements: a third dielectric layer 103 overlapping (and contacting) the first semiconductor substrate 100, wherein the first semiconductor substrate 100 may be positioned (and sandwiched) between the first dielectric layer 101 and the third dielectric layer 103; and a third interconnect set 1023 including at least one interconnect member and electrically connecting the first interconnect set 1021 to the second interconnect set 1022. The third interconnect set 1023 may include one or more via interconnect members. One or more interconnect members of the third interconnect set 1023 may extend through one or more of the elements 103, 100, 101, and 102 and/or the adhesive element.

The first transistor set 1011 may be/include a semiconductor radio frequency (RF) switch and/or other elements. In an embodiment, the first transistor set 1011 may include metal-oxide-semiconductor field-effect transistors (MOSFETs) that are electrically connected in a series connection, share a source electrode and a drain electrode, and form a comb-shaped structure.

The structure of the second transistor set 102 may be different from, analogous to, or substantially identical to the structure of the first transistor set 101. In an embodiment, the first transistor set 1011 may be/include an RF switch element, and the second transistor set 1012 may include a low-voltage logic transistor for forming a logic control circuit and may include a high-voltage high-power transistor for forming an amplifier circuit, wherein the logic control circuit and the amplifier circuit may be compatible with the RF switch element. The second transistor set 1012 may include one or more MOSFETs. The second transistor set 1012 may include at least one laterally diffused metal oxide semiconductor field-effect transistor (LDMOSFET).

The integrated circuit device may include the following elements: a fourth dielectric layer 104 overlapping the third dielectric layer 103, wherein the third dielectric layer 103 may be positioned (and sandwiched) between the fourth dielectric layer 104 and the first semiconductor substrate 100; an integrated passive device (IPD) set 1013 positioned in the fourth dielectric layer 104 and including interconnected passive devices that may include one or more capacitors and/or one or more inductors; and a fourth interconnect set 1024 positioned in the fourth dielectric layer 104 and including at least one interconnect member. The fourth interconnect 104 set may electrically interconnect elements in the IPD set 1013, may be electrically interconnect elements in the third interconnect set 1023, and/or may electrically connect the IPD set 1013 to the third interconnect set 1023. The fourth dielectric layer 104 may have a multilayer structure.

The IPD set 1013 may not overlap any semiconductor transistors positioned in the first semiconductor substrate 100 in a direction perpendicular to a surface (e.g., a bottom surface) of the first semiconductor substrate 100. The IPD set 1013 may not overlap any semiconductor transistors positioned in the second semiconductor substrate 200 in a direction perpendicular to a surface (e.g., a bottom surface) of the second semiconductor substrate 200. Therefore, the IPD set 103 may not substantially interfere with any semiconductor transistors in the integrated circuit device. Advantageously, satisfactory quality and performance of the integrated circuit device may be ensured.

One or more characteristics, such as one or more of the materials, thicknesses, etc., of the first semiconductor substrate 100, the second semiconductor substrate 200, the first dielectric layer 101, the second dielectric layer 102, the third dielectric layer 103, and/or the fourth dielectric layer 104 may be selected and/or configured based on requirements related to the first transistor set 1011 and/or the second transistor set 1012, for optimizing quality and performance of the integrated circuit device.

In an embodiment, at least one of the first semiconductor substrate 100 and the second semiconductor substrate 200 may be formed of a monocrystalline silicon material. One or more of the first dielectric layer 101, the second dielectric layer 102, the third dielectric layer 103, and the fourth dielectric layer 104 may be formed of a dielectric material that contains silicon.

The integrated circuit device may include a horizontal shallow-trench dielectric element 1001 positioned in the first semiconductor substrate 100. One or more interconnect members (e.g., via interconnect members) of the third interconnect set 1023 may be surrounded and insulated by one or more of the dielectric element 1001, the first dielectric layer 101, and the third dielectric layer 103, such that the one or more interconnect members of the third interconnect set 1023 may be insulated in a direction parallel to at least a surface of at least one of the dielectric members 1001, 101, and 103 (e.g., an interface between two of the dielectric members).

The first transistor set 1011 may include one or more switch transistors, which may be one or more depletion-mode MOSFETs.

One or more interconnect members of the third interconnect set 1023 may be formed of at least one of a silicon-containing semiconductor material, tungsten, and copper.

One or more interconnect members of the first interconnect set 1021 and/or the second interconnect set 1022 may be formed of at least one of tungsten and another suitable conductive material.

The second semiconductor substrate 200 may be a high-resistance silicon substrate and may have a surface resistance that is greater than or equal to 100 ohms per square micron.

According to embodiments of the invention, a first set of components of the integrated circuit device (including the first transistor set 1011 and the first semiconductor substrate 100) and a second set of components of the integrated circuit device (including the second transistor set 1012 and the second semiconductor substrate 200) may be separated configured and optimized, may be joined through one or more wafer bonding processes, and may be electrically connected through via interconnection techniques. Advantageously, manufacturing of the integrated circuit device may be substantially effective and efficient, and quality and performance of the integrated circuit device may be substantially satisfactory.

Figure 2A:
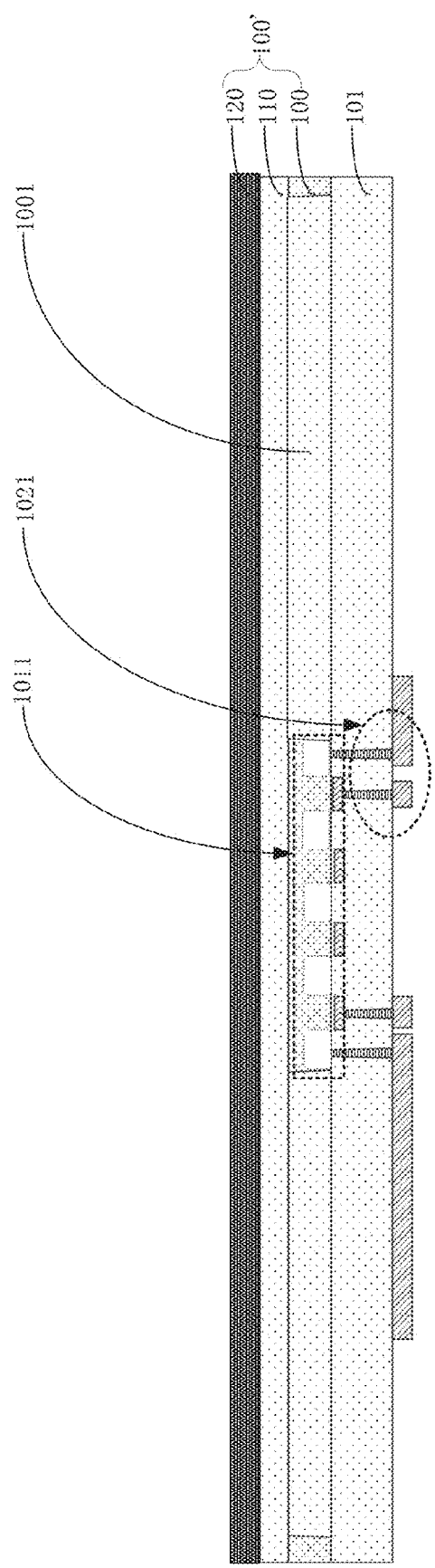
FIG. 2A, FIG. 2B, and FIG. 2C show schematic cross-sectional views that illustrate structures formed in a method for manufacturing an integrated circuit device in accordance with an embodiment of the present invention.
Figure 2B:
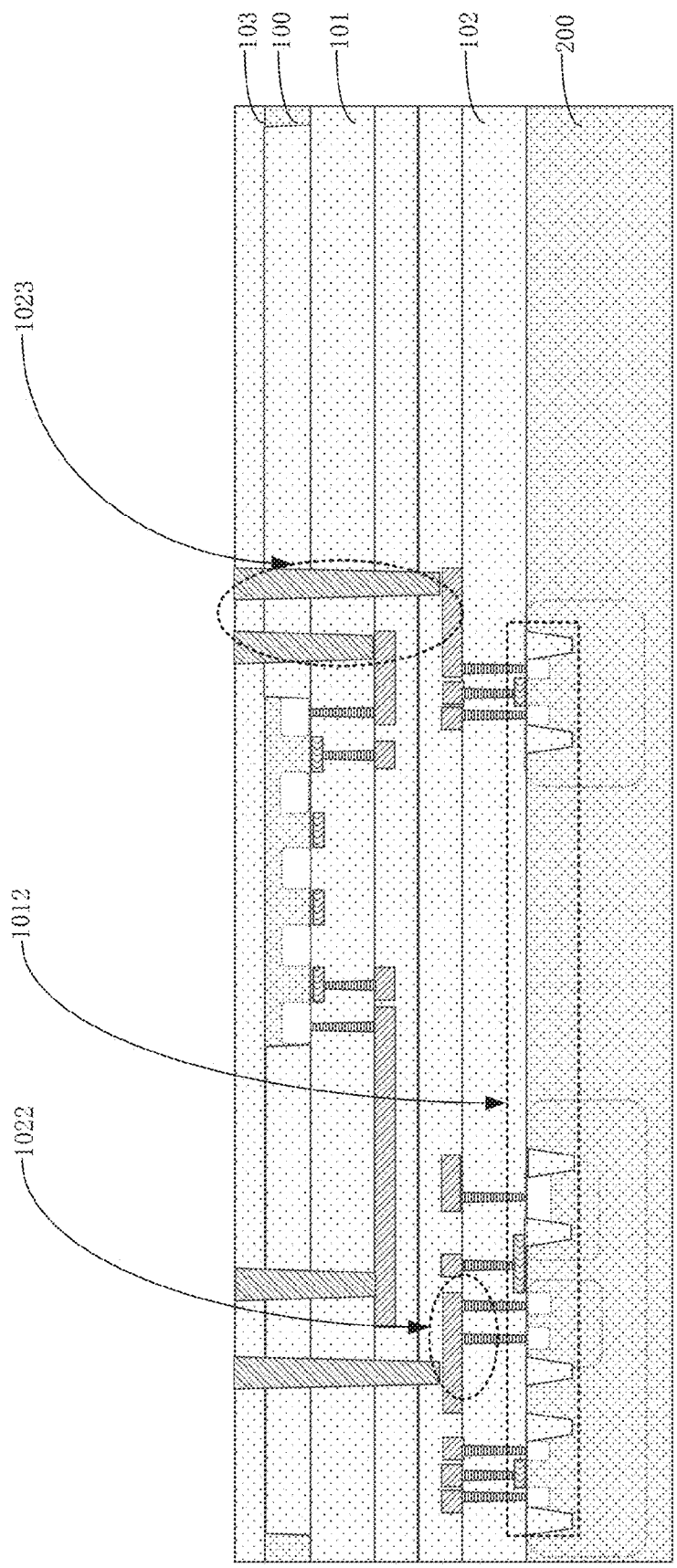
Figure 2C:
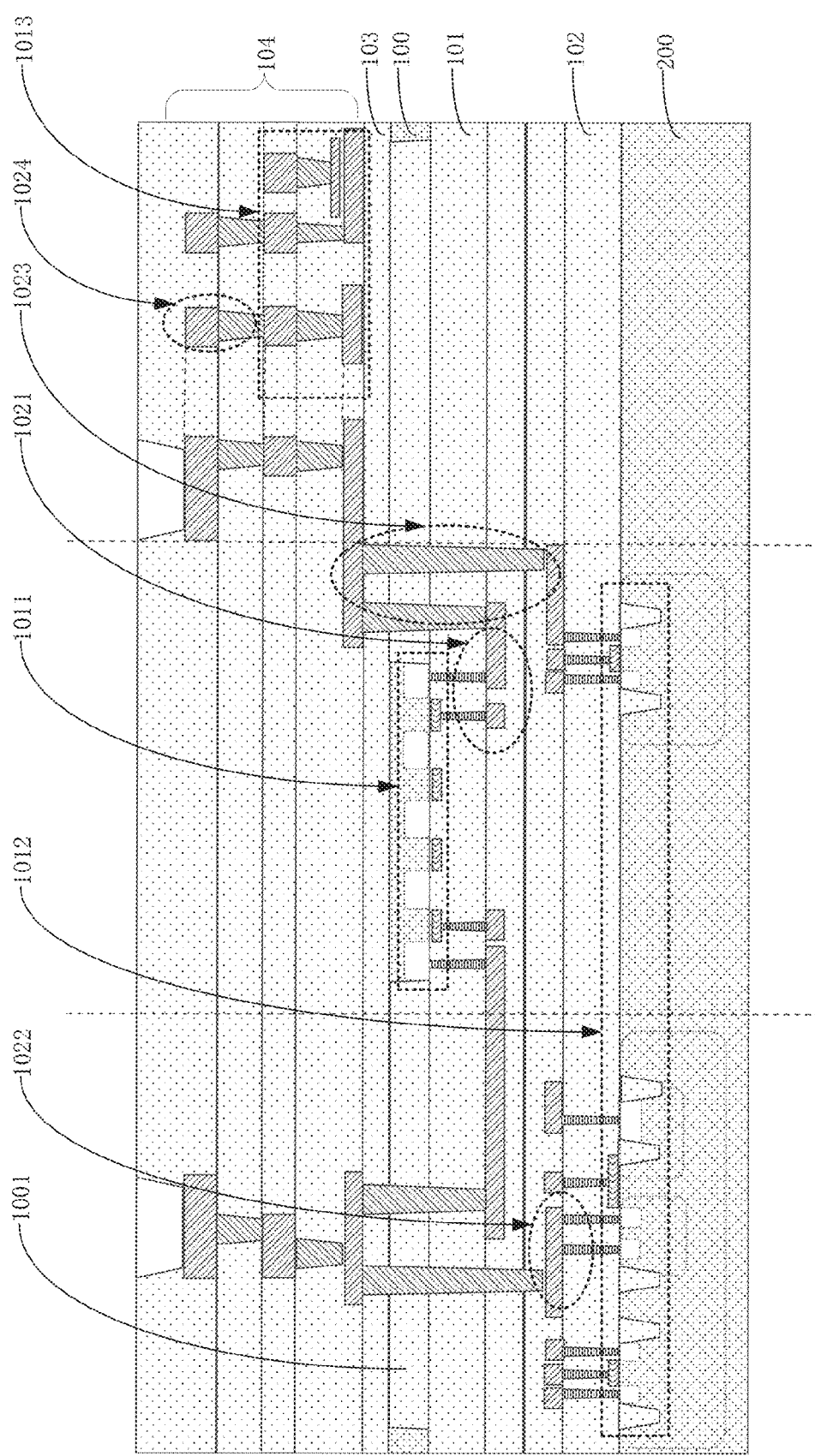
Figure 3:
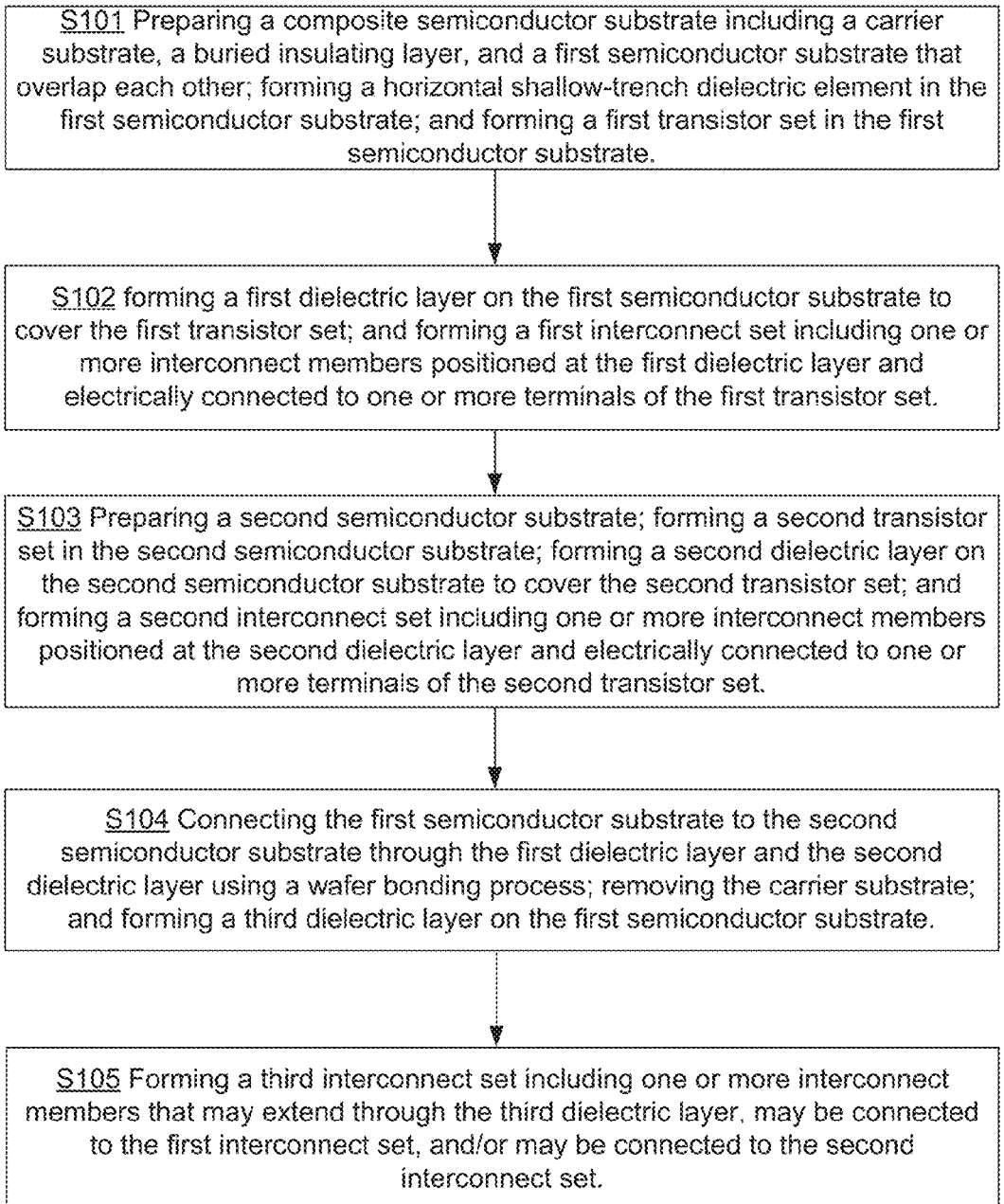
FIG. 3 shows a flowchart that illustrates a method for manufacturing an integrated circuit device in accordance with an embodiment of the present invention.

FIG. 2A, FIG. 2B, and FIG. 2C show schematic cross-sectional views that illustrate structures formed in a method for manufacturing an integrated circuit device in accordance with an embodiment of the present invention. FIG. 3 shows a flowchart that illustrates a method for manufacturing an integrated circuit device, for example, the integrated circuit device related to FIGS. 2A to 2C, in accordance with an embodiment of the present invention.

Referring to FIG. 3, the method may include a step S101, a step S102, a step S103, a step S104, and a step 105.

Referring to FIG. 3 and FIG. 2A, the step S101 may include the following sub-steps: preparing a composite semiconductor substrate 100' that may include a carrier substrate 120, a buried insulating layer 110, and a first semiconductor substrate 100, which may overlap each other; forming a horizontal shallow-trench dielectric element 1001 in the first semiconductor substrate 100; and forming a first transistor set 1011 in the first semiconductor substrate 100 (and/or in the dielectric element 1001). At least a portion of the first transistor set 1011 may be exposed by the first semiconductor substrate 100 (and/or the dielectric element 1001) and/or may protrude beyond the first semiconductor substrate 100 (and/or the dielectric element 1001).

The first transistor set 1011 may be/include a semiconductor radio frequency (RF) switch and/or other elements. In an embodiment, the first transistor set 1011 may include metal-oxide-semiconductor field-effect transistors (MOSFETs) that are electrically connected in a series connection, share a source electrode and a drain electrode, and form a comb-shaped structure.

Referring to FIG. 3 and FIG. 2A, the step S102 may include the following sub-steps: forming a first dielectric layer 101 (which may have a single-layer or multilayer substructure) on the first semiconductor substrate 100, such that the first dielectric layer 101 may cover at least a gate electrode the first transistor set 1011 and/or may completely cover the first transistor set 1011; and forming a first interconnect set 1021 including one or more interconnect members that may be positioned in the first dielectric layer 101 and/or on at least a surface of the first dielectric layer 101 and may be electrically connected to one or more terminals (e.g., one or more source electrodes, drain electrodes, and/or gate electrodes) of the first transistor set 1011.

Referring to FIG. 3 and FIG. 2B, the step S103 may include the following sub-steps: preparing a second semiconductor substrate 200; forming a second transistor set 1012 in the second semiconductor substrate 200, wherein at least a portion of the second transistor set 1012 may be exposed by the second semiconductor substrate 200 and/or may protrude beyond the second semiconductor substrate 200; forming a second dielectric layer 102 (which may have a single-layer or multilayer substructure) on the second semiconductor substrate 200, such that the second dielectric layer 102 may cover at least a gate electrode of the second transistor set 1012 and/or completely cover the second transistor set 1012; and forming a second interconnect set 1022 including one or more interconnect members that may be positioned in the second dielectric layer 102 and/or on at least a surface of the second dielectric layer 102 and may be electrically connected to one or more terminals (e.g., one or more source electrodes, drain electrodes, and/or gate electrodes) of the second transistor set 1012.

Referring to FIG. 3 and FIG. 2B, the step S104 may include the following sub-steps: (mechanically) connecting the first semiconductor substrate 100 to the second semiconductor substrate 200 through the first dielectric layer 101 and the second dielectric layer 102 using one or more wafer bonding processes; removing the carrier substrate 102; and forming a third dielectric layer 103 (which may have a single-layer or multilayer substructure) on the first semiconductor substrate 100, such that the first semiconductor substrate 100 may be positioned between the third dielectric layer 103 and the first dielectric layer 101. The buried insulating layer 110 may be substantially retained, partially retained, or completed removed before the formation of the third dielectric layer 103 on the first semiconductor substrate 103. The buried insulating layer 110 or a retained portion of the insulating layer 110 may be integrated with the third dielectric layer 103 and/or may be positioned between the third dielectric layer 103 and the first semiconductor substrate 100.

Referring to FIG. 3 and FIG. 2B, the step S105 may include forming a third interconnect set 1023 including one or more interconnect members that may extend through the third dielectric layer 103, may be connected to the first interconnect set 1021, and/or may be connected to the second interconnect set 1022. One or more interconnect members (e.g., a first subset) of the third interconnect set 1023 may extend through the third dielectric layer 103, the first semiconductor substrate 100 (particularly the horizontal shallow-trench dielectric element 1001), the first dielectric layer 101, and the second dielectric layer 102 and may be connected to the second interconnect set 1022. One or more interconnect members (e.g., a second subset) of the third interconnect set 1023 may extend through the third dielectric layer 103, the first semiconductor substrate 100 (particularly the horizontal shallow-trench dielectric element 1001), and the first dielectric layer 101 and may be connected to the first interconnect set 1021. One or more interconnect members of the third interconnect set 1023 may be (vertical) via interconnect members.

Referring to FIG. 2C, the method may include the following steps: forming a fourth dielectric layer 104 (which may have a multilayer structure) on the third dielectric layer 103, such that the third dielectric layer 103 may be positioned (and sandwiched) between the fourth dielectric layer 104 and the first semiconductor substrate 100; forming an integrated passive device (IPD) set 1013 in the fourth dielectric layer 104, wherein the IPD set may include interconnected passive devices that may include one or more capacitors and/or one or more inductors; and forming a fourth interconnect set 1024 in the fourth dielectric layer 104, wherein the fourth interconnect set 1024 may include one or more interconnect members. The fourth interconnect set 104 may electrically interconnect elements in the IPD set 1013, may electrically interconnect elements in the third interconnect set 1023, and/or may electrically connect the IPD set 1013 to the third interconnect set 1023. The manufactured integrated circuit device may include the elements and structures illustrated in FIG. 2C and may have one or more features and advantages discussed with reference to FIG. 1.

As can be appreciated from the foregoing discussion, according to embodiments of the invention, a first set of integrated circuit device components and a second set of integrated circuit device components (structurally different from the first set) may be separately configured and optimized, may be joined through one or more wafer bonding processes, and may be electrically connected through via interconnection techniques, such that an integrated circuit device may be manufactured. According to embodiments of the invention, manufacturing of the integrated circuit device may be substantially effective and efficient, and quality and performance of the integrated circuit device may be substantially satisfactory. Embodiments of the invention may be suitable for RF switch devices.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. An integrated circuit device comprising:
   a first semiconductor substrate;
   a first transistor set at least partially positioned in the first semiconductor substrate;
   a first dielectric layer overlapping the first semiconductor substrate and covering a gate electrode of the first transistor set;
   a first interconnect member at least partially positioned in the first dielectric layer and electrically connected to a terminal of the first transistor set;
   a second semiconductor substrate;
   a second transistor set at least partially positioned in the second semiconductor substrate;
   a second dielectric layer connected to the first dielectric layer, positioned between the first dielectric layer and the second semiconductor substrate, and covering a gate electrode of the second transistor set, wherein the first dielectric layer is positioned between the second dielectric layer and the first semiconductor substrate;
   a second interconnect member at least partially positioned in the second dielectric layer and electrically connected to a terminal of the second transistor set;
   a third dielectric layer, wherein the first semiconductor substrate is positioned between the third dielectric layer and the first dielectric layer;
   a third interconnect member extending through the third dielectric layer and electrically connected to the first interconnect member;
   a fourth interconnect member extending through the third dielectric layer and electrically connected to the second interconnect member;
   a fourth dielectric layer overlapping the third dielectric layer, wherein the third dielectric layer is positioned between the fourth dielectric layer and the first semiconductor substrate; and
   a first passive device at least partially positioned in the fourth dielectric layer.

2. The integrated circuit device of claim 1, wherein the first transistor set is a semiconductor radio frequency switch.

3. The integrated circuit device of claim 2, wherein the second transistor set includes a first transistor and a second transistor that are compatible with the semiconductor radio frequency switch, wherein the first transistor is part of a logic control circuit of the integrated circuit device, and wherein the second transistor is part of an amplifier circuit of the integrated circuit device.

4. The integrated circuit device of claim 1, wherein the first transistor set includes metal-oxide-semiconductor field-effect transistors that are electrically connected in a series connection, share a source electrode and a drain electrode, and form a comb-shaped structure.

5. The integrated circuit device of claim 1, wherein the second transistor set includes a laterally diffused metal oxide semiconductor field-effect transistor.

6. The integrated circuit device of claim 1, further comprising:
   a second passive device at least partially positioned in the fourth dielectric layer; and
   a fifth interconnect member at least partially positioned in the fourth dielectric layer and electrically connected to at least two of the first passive device, the second passive device, the third interconnect member, and the fourth interconnect member.

7. The integrated circuit device of claim 1, further comprising:
   a second passive device at least partially positioned in the fourth dielectric layer and electrically connected to the first passive device,
   wherein neither of the first passive device and the second passive device overlaps any semiconductor device at least partially positioned in the first semiconductor substrate or the second semiconductor substrate in a direction perpendicular to an interface between the second semiconductor substrate and the second dielectric layer.

8. The integrated circuit device of claim 1, wherein each of the first semiconductor substrate and the second semiconductor substrate is formed of a monocrystalline silicon material, and wherein each of the first dielectric layer, the second dielectric layer, and the third dielectric layer is formed of a silicon-containing dielectric material.

9. The integrated circuit device of claim 1, further comprising a dielectric element positioned in the first semiconductor substrate, wherein four portions of the fourth interconnect member are respectively surrounded by the third dielectric layer, the dielectric element, the first dielectric layer, and the second dielectric layer.

10. The integrated circuit device of claim 1, wherein the first transistor set includes a depletion-mode metal-oxide-semiconductor field-effect transistor.

11. The integrated circuit device of claim 1, wherein at least one of the third interconnect member and the fourth interconnect member is formed of at least one of a silicon-containing semiconductor material, tungsten, and copper.

12. The integrated circuit device of claim 1, wherein at least one of the first interconnect member and the second interconnect member is formed of tungsten.

13. The integrated circuit device of claim 1, wherein a surface resistance of the second semiconductor substrate is greater than or equal to 100 ohms per square micron.

14. An integrated circuit device comprising:
    a first semiconductor substrate;
    a first transistor set at least partially positioned in the first semiconductor substrate, wherein the first transistor set includes a semiconductor radio frequency switch;
    a first dielectric layer overlapping the first semiconductor substrate and covering a gate electrode of the first transistor set;
    a first interconnect member at least partially positioned in the first dielectric layer and electrically connected to a terminal of the first transistor set;
    a second semiconductor substrate;

a second transistor set at least partially positioned in the second semiconductor substrate, wherein a structure of the second transistor set is substantially different from a structure of the first transistor set;

a second dielectric layer connected to the first dielectric layer, positioned between the first dielectric layer and the second semiconductor substrate, and covering a gate electrode of the second transistor set, wherein the first dielectric layer is positioned between the second dielectric layer and the first semiconductor substrate; and a second interconnect member at least partially positioned in the second dielectric layer, electrically connected to a terminal of the second transistor set, and electrically connected to the first interconnect member.

* * * * *